(12) United States Patent
Ozimek

(10) Patent No.: US 8,369,120 B2
(45) Date of Patent: Feb. 5, 2013

(54) METHODS AND APPARATUS FOR SUM OF ADDRESS COMPARE WRITE RECODE AND COMPARE REDUCTION

(75) Inventor: Timothy Edward Ozimek, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 346 days.

(21) Appl. No.: 12/727,623

(22) Filed: Mar. 19, 2010

(65) Prior Publication Data

US 2011/0228580 A1   Sep. 22, 2011

(51) Int. Cl.
  *G11C 15/00*  (2006.01)
(52) U.S. Cl. ............ 365/49.17; 365/49.1; 365/189.07
(58) Field of Classification Search .......... 365/49.17, 365/49.1, 189.07, 49.7
See application file for complete search history.

(56) References Cited

U.S. PATENT DOCUMENTS

| | | | |
|---|---|---|---|
| 6,088,763 A | 7/2000 | Silberman et al. | |
| 6,161,164 A | 12/2000 | Dhong et al. | |
| 6,373,279 B1* | 4/2002 | Bauer et al. | 326/40 |
| 6,384,634 B1* | 5/2002 | Brissette et al. | 326/93 |
| 6,505,270 B1* | 1/2003 | Voelkel et al. | 711/108 |
| 7,035,127 B1* | 4/2006 | Adams et al. | 365/49.1 |
| 2002/0003719 A1 | 1/2002 | Nishii et al. | |

OTHER PUBLICATIONS

International Search Report and Written Opinion—PCT/US2011/029052—ISA/EPO—Aug. 1, 2011.
Lee Y-H et al: "Address Addition and Decoding Without Carry Propagation" IEICE Transactions on Information and Systems, Information & Systems Society, Tokyo, JP, vol. E80-D, No. 1, Jan. 1, 1997, pp. 98-100, XP000701931, ISSN: 0916-8532 the whole document.
Cortadella, et al., "Evaluation of A+B=K Conditions without Carry Propagation" , IEEE Transactions on Computers, 1992, pp. 1484-1488, vol. 41, No. 11.
Heald, et al., "64-KByte Sum-Addressed-Memory Cache", IEEE Journal of Solid-State Circuits, 1998, pp. 1682-1689, vol. 33, No. 11.

* cited by examiner

*Primary Examiner* — Son Dinh
(74) *Attorney, Agent, or Firm* — Nicholas J. Pauley; Sam Talpalatsky; Jonathan T. Velasco

(57) ABSTRACT

Techniques are described for sum address compare (A+B=K) operation for use in translation lookaside buffers and content addressable memory devices, for example. Address input signals A and B are supplied as input to the A+B=K operation and K is a previous value stored in a plurality of memory cells. In each memory cell, a single logic gate circuit output and its inversion are generated in response to updating the memory cells, wherein each single logic gate circuit has as input an associated memory cell output and a next lowest significant bit adjacent memory cell output. In each of the memory cells, a portion of the A+B=K operation associated with each memory cell is generated in a partial lookup compare circuit wherein the corresponding address input signals A and B are combined with the associated memory cell output and the generated single logic gate circuit output and its inversion during a read lookup compare operation.

20 Claims, 9 Drawing Sheets

\* Api, !Api, Bpi, !Bpi are from Pulsed Latch Interface 304

METHODS AND APPARATUS FOR SUM OF ADDRESS COMPARE WRITE RECODE AND COMPARE REDUCTION

FIELD OF THE DISCLOSURE

The present disclosure relates generally to the field of translating virtual addresses to physical addresses using a content addressable memory and more particularly to implementations of a sum of address compare function for use in a translation look aside buffer (TLB).

BACKGROUND

Many portable products, such as cell phones, laptop computers, personal data assistants (PDAs) and the like, utilize a processing system that executes programs, such as, communication and multimedia programs. A processing system for such products may include multiple processors, complex memory systems using virtual memory hardware and techniques for storing programs and data, controllers, peripheral devices, such as communication interfaces, and fixed function logic blocks configured, for example, on a single chip. At the same time, portable products have a limited energy source in the form of batteries that are often required to support high performance operations from the processing system. To increase battery life it is desired to perform these operations as efficiently as possible. Many personal computers are also being developed with efficient designs to reduce overall energy consumption.

Virtual memory is a technique that presents a very large "virtual" memory space for program development and use while providing for the management of that virtual memory space in a complex memory system having less physical capacity. A complex memory system is conventionally organized in a hierarchy based on capacity and performance of cache memories, with the highest performance and lowest capacity cache located closest to the processor. For example, a level 1 instruction cache and a level 1 data cache would generally be directly coupled to the processor. A level 2 unified cache is in turn connected to the level 1 (L1) instruction and data caches. Further, a system memory is connected to the level 2 (L2) unified cache. The level 1 instruction cache commonly operates at the processor speed and the level 2 unified cache operates slower than the level 1 cache, but has a faster access time than that of the system memory. In addition, virtual memory cache subsystems may include translation look aside buffers (TLBs) to provide fast translations of virtual to physical memory addresses for both instructions in an instruction TLB (ITLB) and data in a data TLB (DTLB). Caches and TLBs generally utilize content addressable memories (CAMs) to store, for example, an address or portion of an address that would be used in the translation process. For TLBs, the CAM may store previously translated virtual page numbers. A virtual page number presented for translation would cause a TLB CAM address tag compare operation in parallel with all of the previously stored address tags. When a match is detected, the output of the TLB would be a physical page number that corresponds to the presented virtual page number. The physical page number is then concatenated with a page offset from the virtual address to be translated to generate the translated physical address that can then be used to address the caches in the memory hierarchy.

In a TLB, for example, to access a value stored in the TLB's CAM generally requires an effective address, such as generated by a base plus offset calculation, which is compared against address tags stored in the CAM. The operation is generally described as an A+B=K operation, where A+B is a virtual address and K is a virtual address or portion thereof that was previously stored in the address tags. Such A+B=K operations may be used in instruction and data caches and instruction and data TLBs. In one approach, an adder is utilized to generate the A+B value and then comparators are provided in a CAM to compare the A+B value with each of the CAM entries. However, this approach is slowed by having dependencies on the carry generation path in the adder.

SUMMARY

Among its several aspects, the present disclosure recognizes that providing more efficient methods and apparatuses for a sum address compare function can improve performance and reduce power requirements in a processor system. To such ends, as well as others, an embodiment of the invention addresses a method for sum address compare (A+B=K) operation, wherein A and B are supplied address input signals and K is a previous value stored in a plurality of memory cells. In each memory cell of the plurality of memory cells a single logic gate circuit output and its inversion are generated in response to updating the memory cells, wherein each single logic gate circuit has an associated memory cell output as a first input and a next lowest significant bit adjacent memory cell output as a second input. In each of the memory cells a portion of the A+B=K operation associated with each memory cell is generated in a partial lookup compare circuit, wherein the corresponding address input signals A and B are combined with the associated memory cell output and the generated single logic gate circuit output and its inversion during a read lookup compare operation.

Another embodiment addresses an apparatus for sum address compare (A+B=K) operation, wherein A and B are supplied address input signals and K is a previous value stored in memory cells. Each memory cell includes a single logic gate circuit having an associated memory cell output as a first input and a next lowest significant bit adjacent memory cell output as a second input and generating an output signal S and its logical negation signal !S in response to updating the memory cells. In each of the memory cells, a sum address compare circuit generates a portion of the A+B=K operation associated with each memory cell for a lookup compare operation during which the corresponding address input signals A and B are enabled to be combined with the associated memory cell output and the S signal and !S signal.

Another embodiment addresses a method for a sum address compare (A+B=K) operation, wherein A and B are supplied address input signals and K is a previous value stored in a plurality of memory cells. Two adjacent memory bits ($M_i$, $M_{i-1}$) are combined to generate an output signal $S_i$ as an exclusive NOR of memory bits ($M_i$, $M_{i-1}$) and its logical negation signal $!S_i$. Two adjacent bits ($A_i$, $A_{i-1}$, $B_i$, $B_{i-1}$) are combined with memory bits $M_i$ and $!M_i$ and outputs $S_i$, and $!S_i$ for a lookup compare operation to detect a miscompare, wherein ! is a logical negate function.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Various aspects of the present invention are illustrated by way of example, and not by way of limitation, in the accompanying drawings, wherein.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well known structures and components are shown in block diagram form in order to avoid obscuring the concepts of the present invention.

Figure 1:
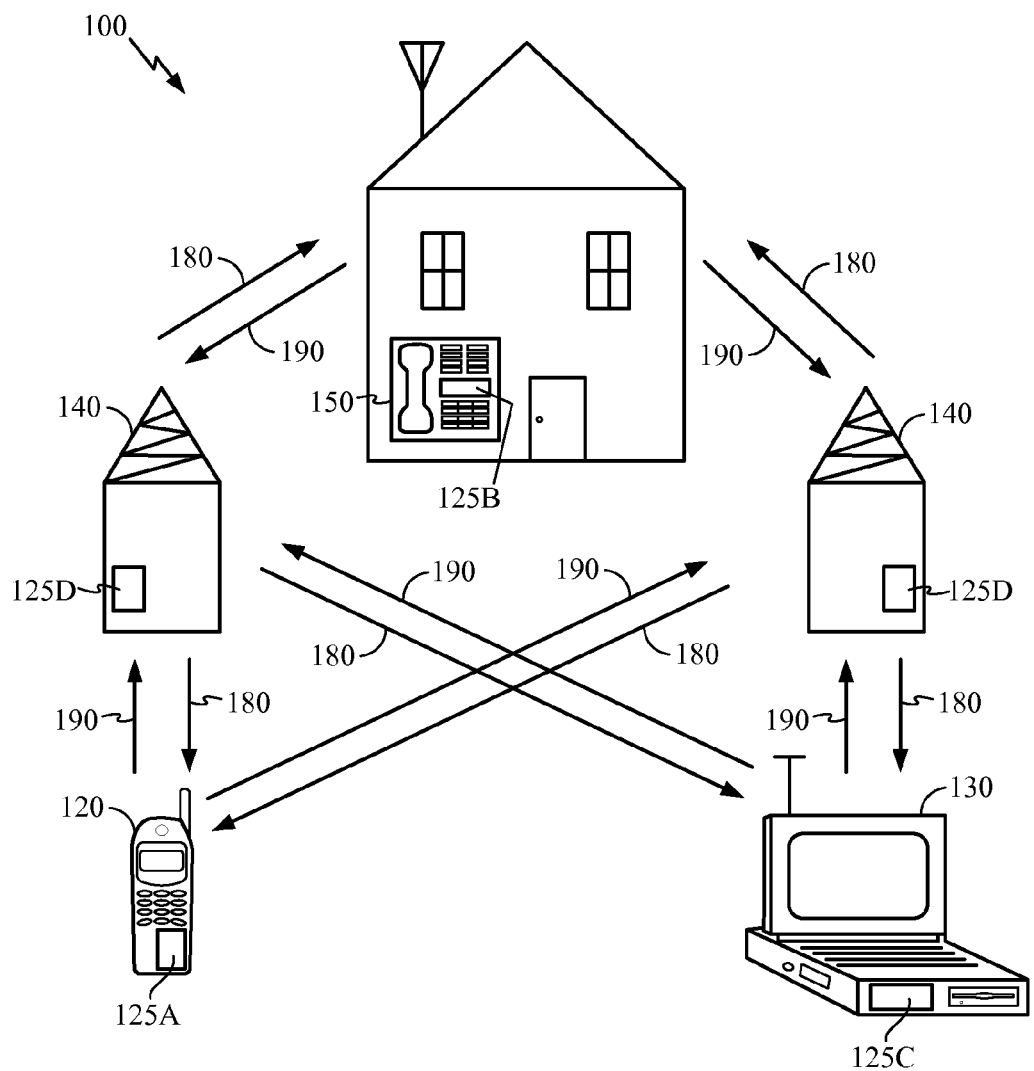
FIG. 1 illustrates a wireless communication system.

FIG. 1 illustrates an exemplary wireless communication system 100 in which an embodiment of the invention may be advantageously employed. For purposes of illustration, FIG. 1 shows three remote units 120, 130, and 150 and two base stations 140. It will be recognized that common wireless communication systems may have many more remote units and base stations. Remote units 120, 130, 150, and base stations 140 which include hardware components, software components, or both as represented by components 125A, 125C, 125B, and 125D, respectively, have been adapted to embody the invention as discussed further below. FIG. 1 shows forward link signals 180 from the base stations 140 to the remote units 120, 130, and 150 and reverse link signals 190 from the remote units 120, 130, and 150 to the base stations 140.

In FIG. 1, remote unit 120 is shown as a mobile telephone, remote unit 130 is shown as a portable computer, and remote unit 150 is shown as a fixed location remote unit in a wireless local loop system. By way of example, the remote units may alternatively be cell phones, pagers, walkie talkies, handheld personal communication system (PCS) units, portable data units such as personal data assistants, or fixed location data units such as meter reading equipment. Although FIG. 1 illustrates remote units according to the teachings of the disclosure, the disclosure is not limited to these exemplary illustrated units. Embodiments of the invention may be suitably employed in any device, such as caches, translation lookaside buffers (TLBs), and fixed function devices, having requirements for an A+B=K computation as addressed herein.

Figure 2:
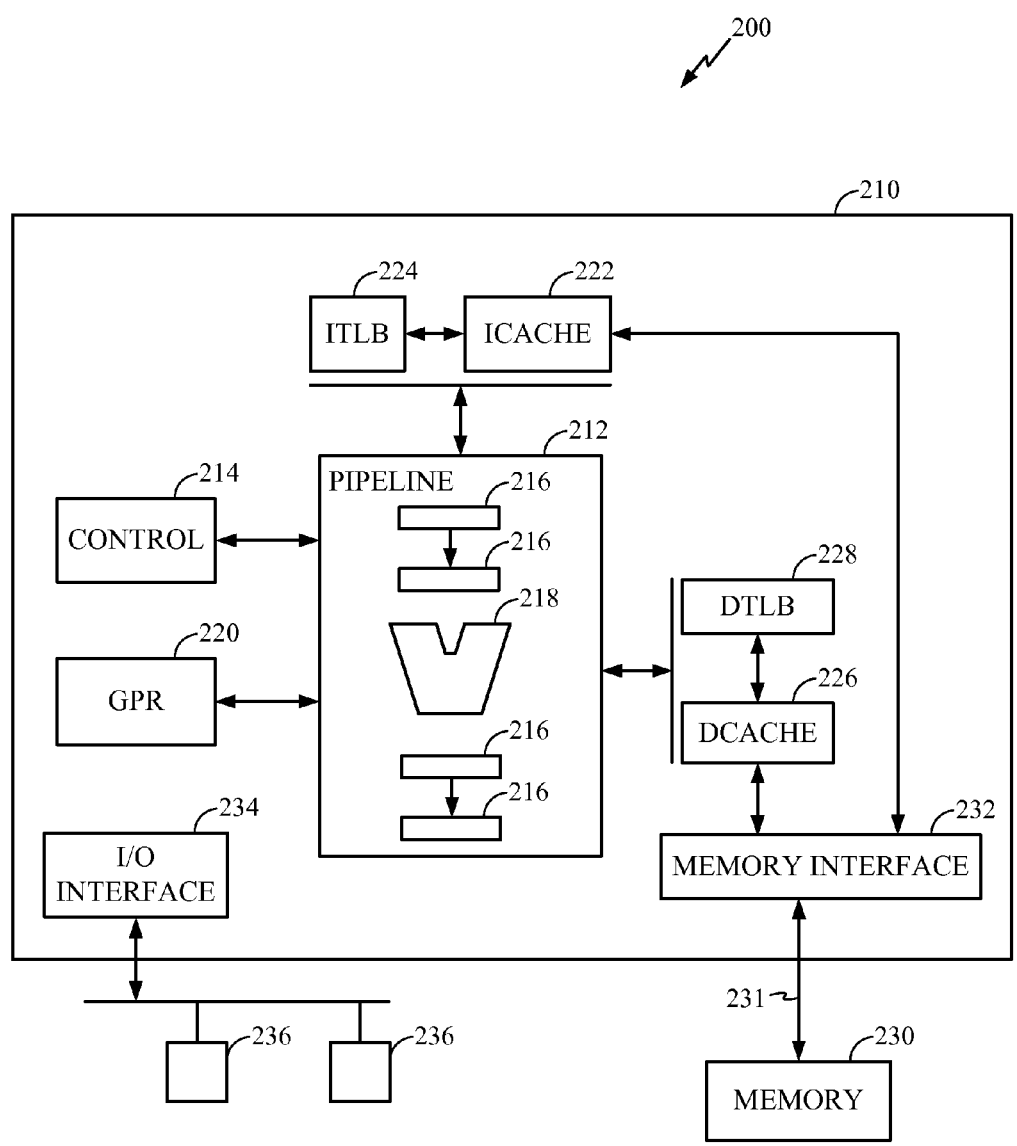
FIG. 2 shows an exemplary processor system having caches configured with content addressable memory having efficient A+B=K implementations.

FIG. 2 shows an exemplary processor system 200 having caches and TLBs configured with content addressable memories (CAMs) using efficient A+B=K implementations, as described in more detail below, which may suitably be employed in components 125A, 125C, 125B, and 125D of FIG. 1. The processor system 200 includes processor 210 which executes instructions in an instruction execution pipeline 212 according to control logic 214. The pipeline 212 includes various registers or latches 216, organized in pipe stages, and one or more arithmetic logic unit (ALU) 218. A general purpose register (GPR) file 220 provides registered values for use by the instruction execution pipeline 212. The pipeline 212 fetches instructions from an instruction cache (Icache) 222, with memory addressing and permissions managed by an instruction translation look aside buffer (ITLB) 224. Data is accessed from a data cache (Dcache) 226, with memory addressing and permissions managed by a data translation look aside buffer (DTLB) 228. Misses in the Icache 222 and/or the Dcache 226 cause an access to main memory 230, under control of a memory interface 232. The processor 210 may also include an input/output (I/O) interface 234 which controls access to various peripheral devices 236, such as a hard disk controller, a universal serial bus (USB) controller, an interactive display device, a radio device coupling a controller to a transmitter and receiver, a memory controller, a bridge device for interconnecting to another bus interconnect device, or the like. Those skilled in the art will recognize that numerous variations of the processor 210 are possible. For example, the memory 230 may consist of a hierarchy of memory devices, such as a level 2 cache, a level 3 cache, bulk memory, a hierarchy of TLBs, and the like. The processor system 200 generally supports virtual to physical address translation using the instruction and data translation look aside buffers (ITLB 224 and DTLB 2228). In addition, one or more processors, such as processor 210, may be included in the processing system 200. The actual number of processors, peripheral devices, and memory devices required for a particular application may vary depending upon processing requirements and design constraints. The processor system 200 may be implemented using application specific integrated circuit (ASIC) technology, field programmable gate array (FPGA) technology, or other programmable logic, discrete gate or transistor logic, or any other available technology suitable for an intended application.

The processor 210, for example, may be configured to execute instructions from a program stored on a computer readable storage medium either directly associated locally with the processor, such as may be available through an instruction cache, or accessible through a peripheral device memory interface. The various memories may include random access memory (RAM), dynamic random access memory (DRAM), synchronous dynamic random access memory (SDRAM), flash memory, read only memory (ROM), programmable read only memory (PROM), erasable programmable read only memory (EPROM), electrically erasable programmable read only memory (EEPROM), compact disk (CD), digital video disk (DVD), other types of removable disks, or any other suitable storage medium.

The processor 210 may utilize virtual addressing techniques for accessing instructions and data from the various memories in the processing system 200. A virtual address is generally partitioned into a high portion and a low portion. The high portion represents a virtual page number that is to be translated to a physical page number. The low portion represents an offset into the page and is the same between the virtual address and the physical address, such that the low portion is not translated. It is recognized that in different systems the page size may vary and it would not be unusual to have systems with 8K byte, 4K byte, or 2K byte pages. One effect of the choice of page size is the number of bits in the high portion of the virtual address partition that is to be translated. For example, in a system having a 32-bit virtual address with 4K byte pages, the virtual address would be partitioned into a high 20-bit portion, bits [31:12] and a low 12-bit portion, bits [11:0]. The high 20-bit portion represents a virtual page number that is to be translated to a physical page number. The low 12-bit portion represents a 4K byte offset into the page and is not translated.

A virtual address may be formed by a base address plus offset calculation, indexing, or other address generation function that requires an addition or mathematical operation. Rather than form the virtual address first by adding, for example, the base address plus an offset followed by a separate CAM compare operation, the A+B=K function may be combined in a CAM, also referred to as a sum address compare (SAC) function. An approach using this method is described in a paper by Jordi Cortadella and Jose M. Llaberia, "Evaluation of A+B=K Condition Without Carry Propagation", IEEE Transactions On Computers, Vo. 41, No. 11, November, 1992 which is hereby incorporated by reference herein in its entirety. A problem with a general implementation of the SAC function, such as the one above, is the affect the implementation has on the worst case timing path to generate the function.

As described in connection with one aspect of a present approach, a portion of a new SAC circuit, that is associated with logic operations on CAM stored memory values, is evaluated prior to a CAM compare read operation thereby reducing the latency to resolve the full SAC function. For example, such logic operations may be evaluated during a CAM memory cell update. The new SAC circuit logically combines the addition and compare operation to reduce resources and latency to execute the A+B=K operation. The logic operations used in the following discussion are: "+" for addition, "&" for a logical AND function, "!" for a logical negate function, and "|" for a logical OR function. The new SAC circuit logically combines two adjacent bits ($A_i$, $A_{i-1}$, $B_i$, $B_{i-1}$) with corresponding memory bits ($M_i$, $M_{i-1}$). Three logical combinations $P_i$, $G_i$, and $Z_i$ of input bits $A_i$ and $B_i$ are examined, where:

$P_i=(A_i\&!B_i)|(!A_i\&B_i)$ where $P_i=1$ when $\{A_i,B_i\}=\{1,0\}$ or $\{0,1\}$      Equation 1

$G_i=A_i\&B_i$ where $G_i=1$ when $\{A_i,B_i\}=\{1,1\}$      Equation 2

$Z_i=!A_i\&!B_i$ where $Z_i=1$ when $\{A_i,B_i\}=\{0,0\}$      Equation 3

Two adjacent values of P, G, and Z, $\{P_i, G_i, Z_i\}$ and $\{P_{i-1}, G_{i-1}, Z_{i-1}\}$, when combined, produce nine combinations, listed in the following table, from which a set of mismatch equations may be generated, as described in more detail below.

| | | | | | |
|---|---|---|---|---|---|
| $G_i$ | $G_{i-1}$ | $P_i$ | $G_{i-1}$ | $Z_i$ | $G_{i-1}$ |
| $G_i$ | $P_{i-1}$ | $P_i$ | $P_{i-1}$ | $Z_i$ | $P_{i-1}$ |
| $G_i$ | $Z_{i-1}$ | $P_i$ | $Z_{i-1}$ | $Z_i$ | $Z_{i-1}$ |

The mismatch equations are based on the sum of two adjacent bits and a carry-in $C_{i-1}$ as shown in equation 4:

$A_iA_{i-1}+B_iB_{i-1}+C_{i-1}=R_iR_{i-1}$      Equation 4

For the $G_i G_{i-1}$ combination where $G_i=1$ and $G_{i-1}=1$, equation 4 may be evaluated for the two possible states $\{0,1\}$ of $C_{i-1}$. Since $G_i=1$, $\{A_i,B_i\}=\{1,1\}$ and since $G_{i-1}=1$, $\{A_{i-1},B_{i-1}\}=\{1,1\}$. The evaluation of equation 4 produces the following two situations that generate two results of $R_i R_{i-1}$ depending on the carry-in value:

| $G_i G_{i-1}$ combination | | | |
|---|---|---|---|
| $A_i A_{i-1}$ | $B_i B_{i-1}$ | $C_{i-1}$ | $R_i R_{i-1}$ |
| 11 | 11 | 0 | 10 |
| 11 | 11 | 1 | 11 |

In the SAC equation of A+B=K, the results $R_i R_{i-1}$ are compared against memory values $M_i M_{i-1}$. When comparing for the $i^{th}$ bit, the result value $R_i$ is always a "1" independent of the carry-in value. Thus, for the $G_i G_{i-1}$ combination, a miscompare occurs when $M_i=0$. A mismatch equation for the $G_i G_{i-1}$ combination is given by equation 5:

mismatch-$G_iG_{i-1}=G_i\&G_{i-1}\&!M_i$      Equation 5

The following set of tables and their corresponding mismatch equations are listed as follows:

| $G_i P_{i-1}$ combination | | | |
|---|---|---|---|
| $A_i A_{i-1}$ | $B_i B_{i-1}$ | $C_{i-1}$ | $R_i R_{i-1}$ |
| 11 | 10 | 0 | 01 |
| 11 | 10 | 1 | 10 | mismatch-$G_iP_{i-1}=(G_i\&P_{i-1}\&M_i\&M_{i-1})|(G_i\&P_{i-1}\&!M_i\&!M_{i-1})$      Equation 6

| $G_i Z_{i-1}$ combination | | | |
|---|---|---|---|
| $A_i A_{i-1}$ | $B_i B_{i-1}$ | $C_{i-1}$ | $R_i R_{i-1}$ |
| 10 | 10 | 0 | 00 |
| 10 | 10 | 1 | 01 | mismatch-$G_iZ_{i-1}=G_i\&Z_{i-1}\&M_i$      Equation 7

| $P_i G_{i-1}$ combination | | | |
|---|---|---|---|
| $A_i A_{i-1}$ | $B_i B_{i-1}$ | $C_{i-1}$ | $R_i R_{i-1}$ |
| 01 | 11 | 0 | 00 |
| 01 | 11 | 1 | 01 | mismatch-$P_i G_{i-1} = P_i \& G_{i-1} \& M_i$  Equation 8

| $P_i P_{i-1}$ combination | | | |
|---|---|---|---|
| $A_i A_{i-1}$ | $B_i B_{i-1}$ | $C_{i-1}$ | $R_i R_{i-1}$ |
| 01 | 10 | 0 | 11 |
| 01 | 10 | 1 | 00 | mismatch-$P_i P_{i-1} = (P_i \& P_{i-1} \& M_i \& !M_{i-1}) | (P_i \& P_{i-1} \& !M_i \& M_{i-1})$  Equation 9

| $P_i Z_{i-1}$ combination | | | |
|---|---|---|---|
| $A_i A_{i-1}$ | $B_i B_{i-1}$ | $C_{i-1}$ | $R_i R_{i-1}$ |
| 00 | 10 | 0 | 10 |
| 00 | 10 | 1 | 11 | mismatch-$P_i Z_{i-1} = P_i \& Z_{i-1} \& !M_i$  Equation 10

| $Z_i G_{i-1}$ combination | | | |
|---|---|---|---|
| $A_i A_{i-1}$ | $B_i B_{i-1}$ | $C_{i-1}$ | $R_i R_{i-1}$ |
| 01 | 01 | 0 | 10 |
| 01 | 01 | 1 | 11 | mismatch-$Z_i G_{i-1} = Z_i \& G_{i-1} \& !M_i$  Equation 11

| $Z_i P_{i-1}$ combination | | | |
|---|---|---|---|
| $A_i A_{i-1}$ | $B_i B_{i-1}$ | $C_{i-1}$ | $R_i R_{i-1}$ |
| 01 | 00 | 0 | 01 |
| 01 | 00 | 1 | 10 | mismatch-$Z_i P_{i-1} = (Z_i \& P_{i-1} \& M_i \& M_{i-1}) | (Z_i \& P_{i-1} \& !M_i \& !M_{i-1})$  Equation 12

| $Z_i Z_{i-1}$ combination | | | |
|---|---|---|---|
| $A_i A_{i-1}$ | $B_i B_{i-1}$ | $C_{i-1}$ | $R_i R_{i-1}$ |
| 00 | 00 | 0 | 00 |
| 00 | 01 | 1 | 01 | mismatch-$Z_i Z_{i-1} = Z_i \& Z_{i-1} \& M_i$  Equation 13

The minterms of equations 5-13 are listed below as follows:

| Equation | Minterm | Reference Letter |
|---|---|---|
| 5 | $G_i \& G_{i-1} \& !M_i$ | A |
| 6 | $G_i \& P_{i-1} \& M_i \& M_{i-1}$ | B |
| 6 | $G_i \& P_{i-1} \& !M_i \& !M_{i-1}$ | C |
| 7 | $G_i \& Z_{i-1} \& M_i$ | D |
| 8 | $P_i \& G_{i-1} \& M_i$ | E |
| 9 | $P_i \& P_{i-1} \& M_i \& !M_{i-1}$ | F |
| 9 | $P_i \& P_{i-1} \& !M_i \& M_{i-1}$ | G |
| 10 | $P_i \& Z_{i-1} \& !M_i$ | H |
| 11 | $Z_i \& G_{i-1} \& !M_i$ | I |
| 12 | $Z_i \& P_{i-1} \& M_i \& M_{i-1}$ | J |
| 12 | $Z_i \& P_{i-1} \& !M_i \& !M_{i-1}$ | K |
| 13 | $Z_i \& Z_{i-1} \& M_i$ | L |

The identities $P_i = !G_i \& !Z_i$ and $!P_i = G_i | Z_i$ are used to combine minterms A and I, B and J, C and K, and D and L from the above table to the following listing below of eight minterms:

| Combined Minterm | Reference Letter |
|---|---|
| $!P_i \& G_{i-1} \& !M_i$ | AA |
| $!P_i \& P_{i-1} \& M_i \& M_{i-1}$ | BB |
| $!P_i \& P_{i-1} \& !M_i \& !M_{i-1}$ | CC |
| $!P_i \& Z_{i-1} \& M_i$ | DD |
| $P_i \& G_{i-1} \& M_i$ | EE |
| $P_i \& P_{i-1} \& M_i \& !M_{i-1}$ | FF |
| $P_i \& P_{i-1} \& !M_i \& M_{i-1}$ | GG |
| $P_i \& Z_{i-1} \& !M_i$ | HH |

Further analysis and simulations verify that these combined minterms above and an evaluation of the carry-in, as described in further detail below, may be used for the A+B=K operation.

The following variables $S_i$ and $!S_i$ are defined which depend only on memory values:

$$S_i = (!M_i \& !M_{i-1}) | (M_i \& M_{i-1})$$  Equation 14

$$!S_i = (!M_i \& M_{i-1}) | (M_i \& !M_{i-1})$$  Equation 15

Using equations 14 and 15, the minterms BB and CC and FF and GG are combined reducing the eight minterms AA-HH of the previous table to six minterms 608-610 and 614-616, in the Table of Final Minterms below and described in more detail below in conjunction with the description of FIG. 6B.

Figure 6A:
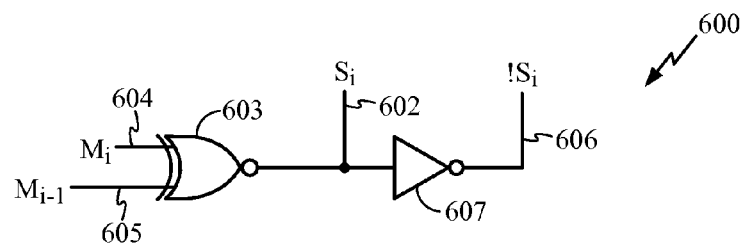
FIG. 6A illustrates an S signal circuit with outputs S and !S dependent upon memory cell input values.
Figure 6B:
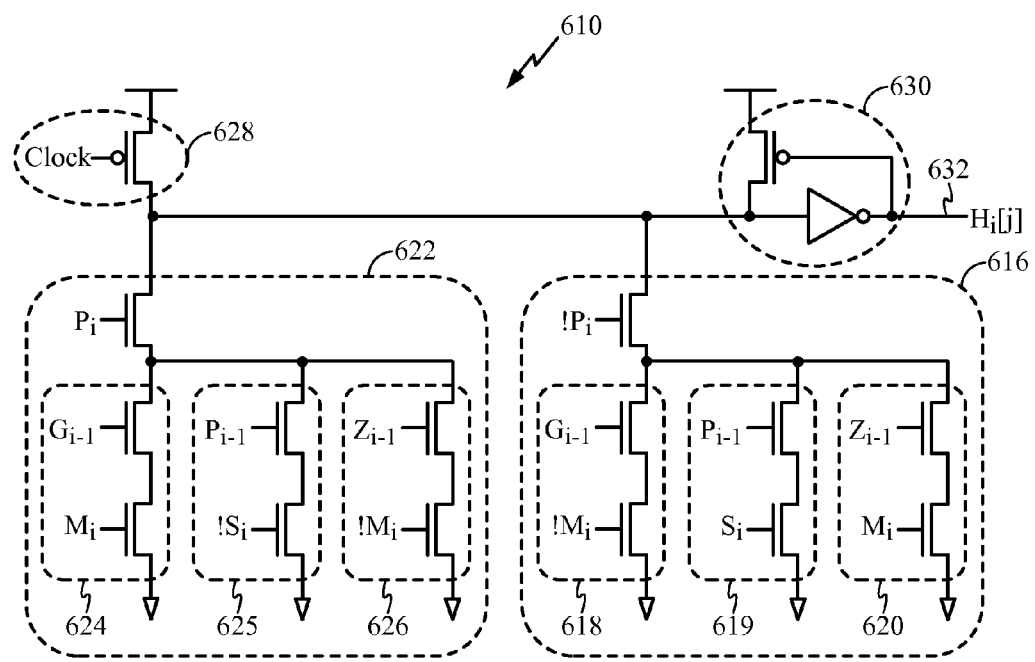
FIG. 6B illustrates a new SAC circuit for use with the memory cells of FIG. 4.

| Table of Final Minterms | | |
|---|---|---|
| Combined Minterm | Reference FIG. 6B | Reference FIG. 6B |
| $!P_i \& G_{i-1} \& !M_i$ | 618 | 616 |
| $!P_i \& P_{i-1} \& S_i$ | 619 | |
| $!P_i \& Z_{i-1} \& M_i$ | 620 | |
| $P_i \& G_{i-1} \& M_i$ | 624 | 622 |
| $P_i \& P_{i-1} \& !S_i$ | 625 | |
| $P_i \& Z_{i-1} \& !M_i$ | 626 | |

Equation 14 for $S_i$ and equation 15 for $!S_i$ are dependent only on memory values, which allows circuit output values $S_i$ and $!S_i$ to be determined in the write cycle of a CAM update. Thus, the delays in generating $S_i$ and $!S_i$ advantageously do not affect the latency for determining a miscompare during a read operation. With reference to FIG. 6A, a single logic gate circuit, such as exclusive NOR gate 603, generates the $S_i$ signal 602 output and its inversion $!S_i$ signal 606, by inverter 607, in each memory cell thus responding to memory cell outputs $M_i$ and $M_{i-1}$. It is noted that the memory cell outputs $M_i$ and $M_{i-1}$ may change due to updating the memory cells which generally occur with less frequency than read lookup compare operations. With reference to FIG. 6B, the six minterms 618-620 and 624-626, which include the use of the $S_i$ signal 602 output and its inversion $!S_i$ signal 606, are used in a new SAC circuit 610 that is included in the memory cells of a CAM tag array as described in further detail below.

An end SAC circuit for the least significant bit is determined from values of $P_i$, $G_i$, $Z_i$ and $C_{in}$, which when combined, produce three combinations from which a set of mismatch equations may be generated, as described in more detail below. For example, with the least significant bit i=12, the three combinations are listed as:

| | |
|---|---|
| $G_{12}$ | $C_{in}$ |
| $P_{12}$ | $C_{in}$ |
| $Z_{12}$ | $C_{in}$ |

The mismatch equations are based on the sum of two adjacent bits and a carry-in $C_{in}$ as shown in equation 16:

$$A_{12} + B_{12} + C_{in} = R_i \quad \text{Equation 16}$$

For $G_{12}=1$, equation 16 may be evaluated for the two possible states $\{0,1\}$ of $C_{in}$. Since $G_{12}=1$, $\{A_{12}, B_{12}\} = \{1,1\}$. The evaluation of equation 16 produces the following two situations that generate two results for $R_{12}$ depending on the carry-in value:

| $G_{12} C_{in}$ combination | | | |
|---|---|---|---|
| $A_{12}$ | $B_{12}$ | $C_{in}$ | $R_{12}$ |
| 1 | 1 | 0 | 0 |
| 1 | 1 | 1 | 1 |

A mismatch equation for the $G_i C_{in}$ combination is given by equation 17:

$$\text{mismatch-}G_{12}C_{in} = (G_{12} \& !C_{in} \& M_{12}) | (G_{12} \& C_{in} \& !M_{12}) \quad \text{Equation 17}$$

Two further tables and their corresponding mismatch equations are are set forth as follows:

| $P_{12} C_{in}$ combination | | | |
|---|---|---|---|
| $A_{12}$ | $B_{12}$ | $C_{in}$ | $R_{12}$ |
| 0 | 1 | 0 | 1 |
| 0 | 1 | 1 | 0 |

$$\text{mismatch-}P_{12}C_{in} = (P_{12} \& !C_{in} \& !M_{12}) | (P_{12} \& C_{in} \& M_{12}) \quad \text{Equation 18}$$

| $Z_{12} C_{in}$ combination | | | |
|---|---|---|---|
| $A_{12}$ | $B_{12}$ | $C_{in}$ | $R_{12}$ |
| 0 | 0 | 0 | 0 |
| 0 | 0 | 1 | 1 |

$$\text{mismatch-}Z_{12}C_{in} = (Z_{12} \& !C_{in} \& M_{12}) | (Z_{12} \& C_{in} \& !M_{12}) \quad \text{Equation 19}$$

The minterms of equations 17-19 are listed as follows:

| Equation | Minterm | Reference Letter |
|---|---|---|
| 17 | $G_{12} \& !C_{in} \& M_{12}$ | A |
| 17 | $G_{12} \& C_{in} \& !M_{12}$ | B |
| 18 | $P_{12} \& !C_{in} \& !M_{12}$ | C |
| 18 | $P_{12} \& C_{in} \& M_{12}$ | D |
| 19 | $Z_{12} \& !C_{in} \& M_{12}$ | E |
| 19 | $Z_{12} \& C_{in} \& !M_{12}$ | F |

The identity $!P_i = G_i | Z_i$ is used to combine minterms A and E and B and F to the following listing of four minterms in the Table of Final LSB Minterms which are described in more detail below in conjunction with a discussion of FIG. 6C.

Figure 6C:
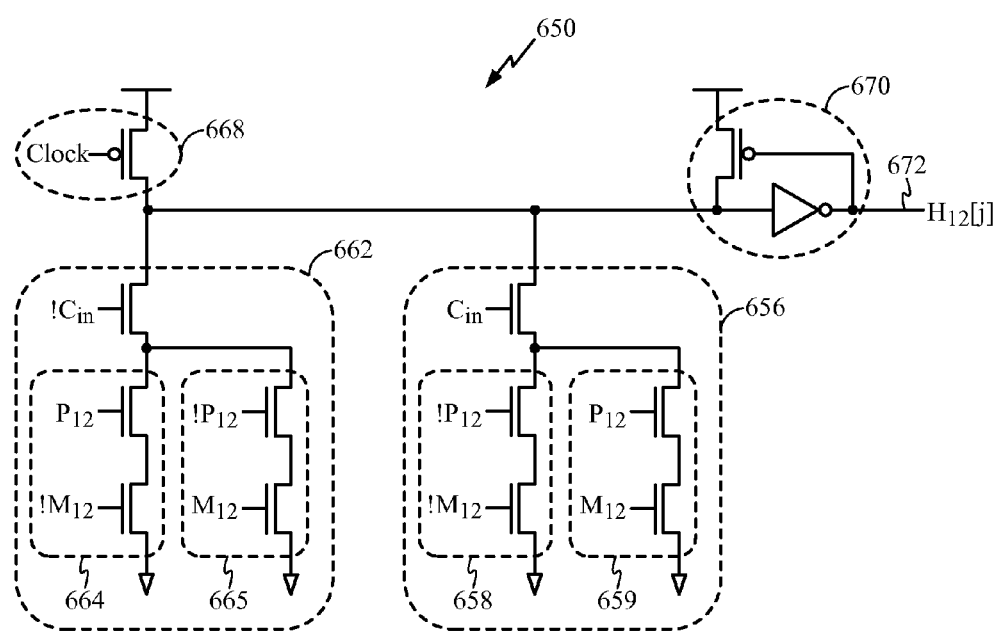
FIG. 6C illustrates an end SAC circuit for use with the least significant bit (LSB) memory cell of FIG. 4.

| Table of Final LSB Minterms | | |
|---|---|---|
| Combined Minterm | Reference FIG. 6C | Reference FIG. 6C |
| $!C_{in} \& P_{12} \& !M_{12}$ | 664 | 662 |
| $!C_{in} \& !P_{12} \& M_{12}$ | 665 | |
| $C_{in} \& !P_{12} \& !M_{12}$ | 658 | 656 |
| $C_{in} \& P_{12} \& M_{12}$ | 659 | |

Figure 3:
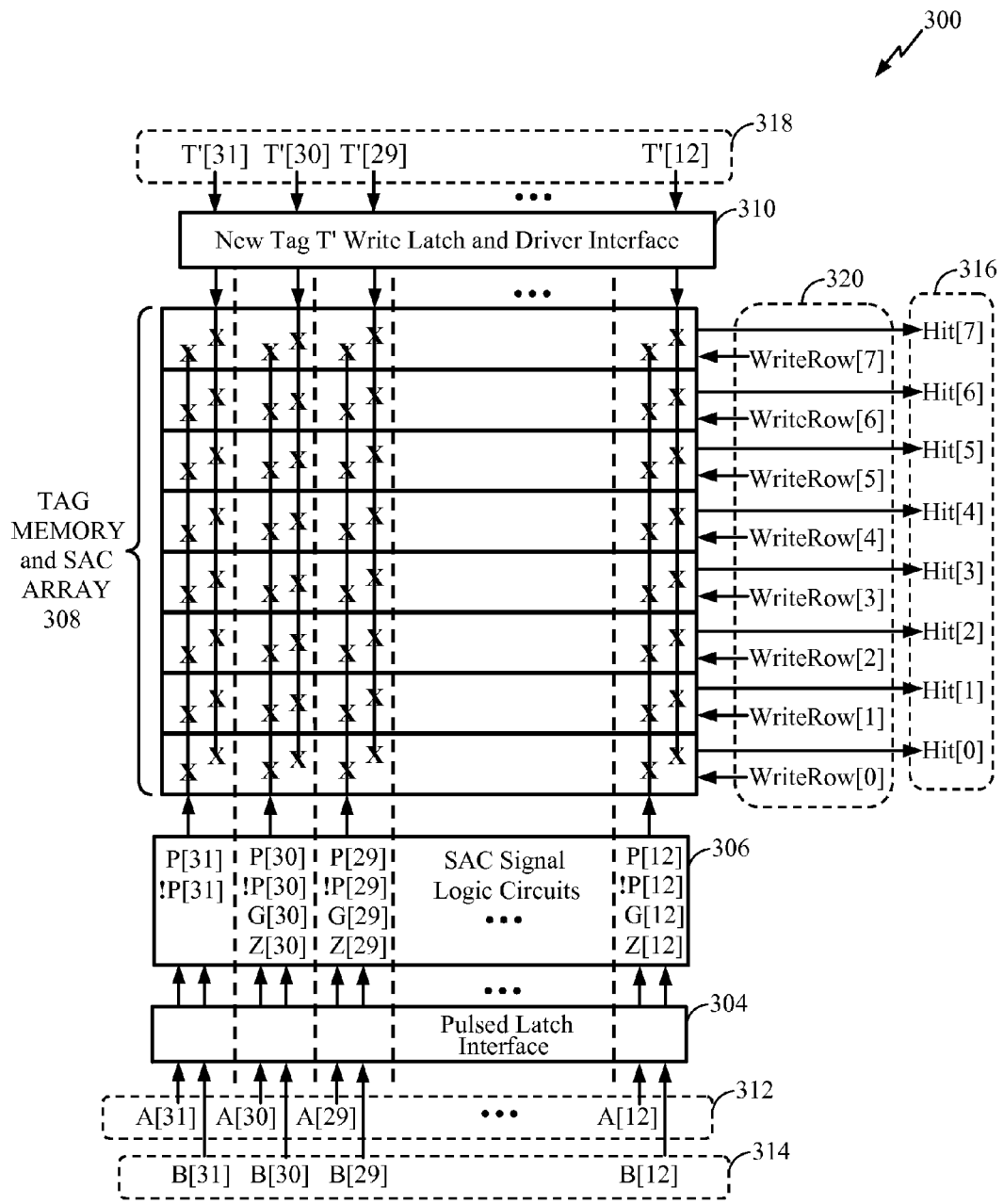
FIG. 3 illustrates an exemplary A+B=K content addressable memory (CAM) circuit for use in a translation look aside buffer (TLB)

FIG. 3 illustrates an exemplary A+B=K CAM circuit 300 for use in a translation look aside buffer (TLB). The A+B=K CAM circuit 300 includes a pulsed latch interface 304, sum address compare (SAC) signal logic circuits 306, a tag memory and SAC array 308, and new tags T' write latch and driver interface 310. The A+B=K CAM circuit 300 is used for virtual translation, for example, in a system having a 32-bit virtual address with 4K byte pages, such as may be used in ITLB 224 and DTLB 228 of FIG. 2. A virtual address would be partitioned into a high 20-bit portion, bits [31:12] and a low 12-bit portion, bits [11:0]. The high 20-bit portion represents a virtual page number that is to be translated to a physical page number. The low 12-bit portion represents a 4K byte page offset into the page and is not translated.

A virtual address is formed by adding, for example, a base address A[31:12] 312 with an offset value B[31:12] 314. The virtual address is then compared to stored tag values in the tag memory and SAC array 308 to generate row by row hit indications 316. The row by row hit indications 316 are also combined to generate a single hit indication if any match is found in the tag memory and SAC array 308. Each row of the tag memory and SAC array 308 receives from the SAC signal logic circuits 306 SAC signals, such as the P, G, and Z signals used in the table of final minterms described above.

Whenever an address is not found, the TLB may write new tags T'[31:12] 318, into the tag memory and SAC array 308. The new tags T'[31:12] 318 are latched and driven to the tag memory and SAC array 308 by the new tag T' write latch and driver interface 310 and written into the memory under control of row write signals 320. A more detailed view of a row in the tag memory and SAC circuit 308 is shown in FIG. 4 and described below.

Figure 4:
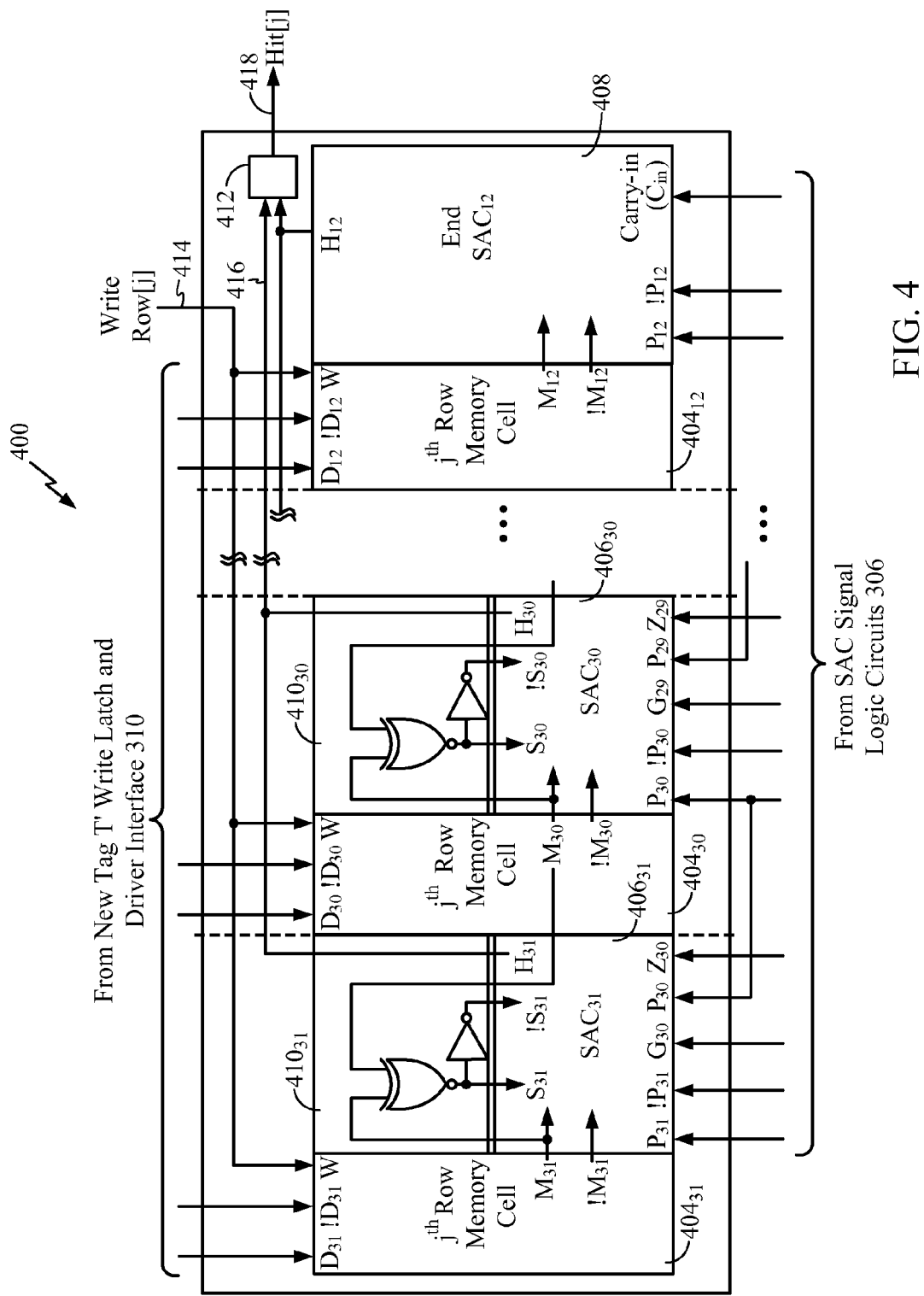
FIG. 4 illustrates an exemplary $j^{th}$ row tag memory of the A+B=K CAM circuit shown in FIG. 3.

FIG. 4 illustrates an exemplary $j^{th}$ row tag memory 400 of the A+B=K CAM circuit 300 shown in FIG. 3. The $j^{th}$ row tag memory 400 includes memory cells, M[31:12] $404_{31}$-$404_{12}$, for each bit of the stored tag value, new SAC circuits $406_{31}$-$406_{13}$ associated with each memory cell bit [31:13], end SAC circuit 408 associated with the least significant bit of the stored tag value, an S and !S logic circuit for bits [31:13] $410_{31}$-$410_{13}$, and a hit logic circuit 412. The S[31:13] and !S[31:13] circuits $410_{31}$-$410_{13}$ are implemented according to equations 14 and 15, respectively. The new SAC[31:13] circuits $406_{31}$-$406_{13}$ are implemented according to the table of final minterms above using the SAC signals $P_i$, $P_{i-1}$, $G_i$, and $Z_i$ from the SAC signal logic circuit 306 of FIG. 3 with timing appropriate for a lookup compare operation. When a new tag value is to be written to the $j^{th}$ row tag memory 400, new tag T' values are provided to the memory cells M[31:12] from the new tag T' write latch and driver interface 310 of FIG. 3. The new tag T' values are written to the memory cells under control of a write row[j] signal 414.

In one embodiment, hit outputs of each new SAC circuit indicate a miss with the compare operation on any bit mismatch pulling a hit signal 418 low. For signal loading reasons, hit signal 416 may be connected to a portion of the SAC hit outputs. Thus, a hit circuit 412 is utilized to produce the hit signal output 418 that is representative of match compare on the whole row.

Figure 5A:
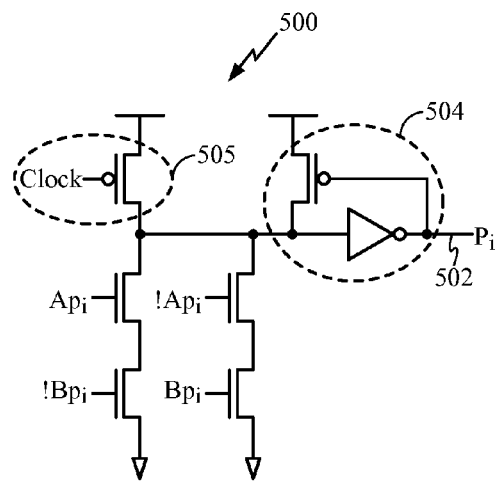
FIGS. 5A-5D illustrates sum address compare (SAC) signal logic circuits suitable for use in the A+B=K CAM circuit shown in FIG. 3.
Figure 5C:
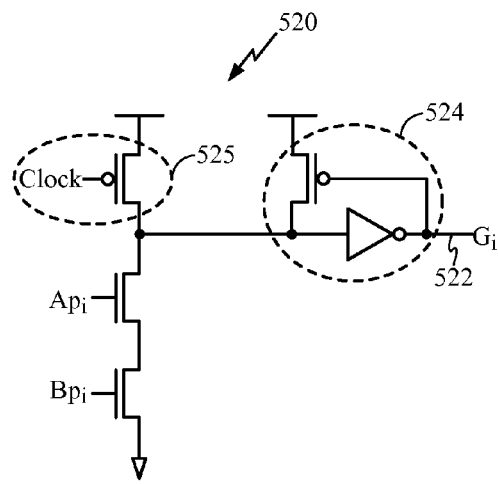
Figure 5B:
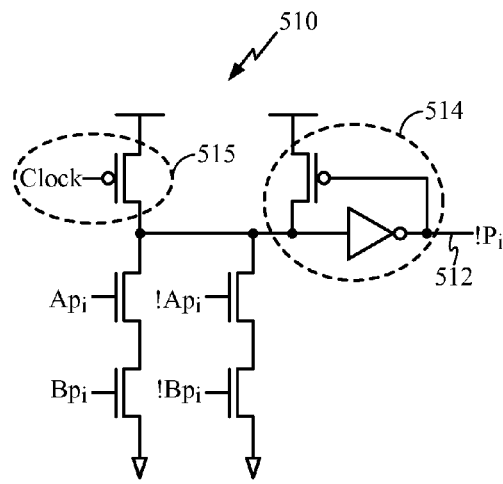
Figure 5D:
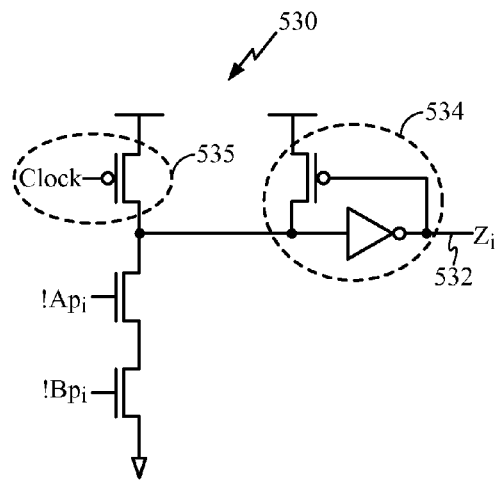

FIGS. 5A-5D illustrates sum address compare (SAC) signal logic circuits 500, 510, 520, and 530, respectively, suitable for use in the A+B=K CAM circuit 300 shown in FIG. 3. For each tag bit position, pulsed $P_i$ signal 502 in FIG. 5A, pulsed !$P_i$ signal 512 in FIG. 5B, pulsed $G_i$ signal 522 in FIG. 5C, and pulsed $Z_i$ signal 532 in FIG. 5D are generated. In one embodiment, n-channel metal oxide semiconductor field effect transistors (MOSFETs) or NFETs are used to implement the SAC signal logic circuits 500. Pulsed address signals $Ap_i$, !$Ap_i$, $Bp_i$, and !$Bp_i$ generated from the pulsed latch interface 304 are used as inputs by the $P_i$ circuit 500, the !$P_i$ circuit 510, the $G_i$ circuit 520, and the $Z_i$ circuit 530. The $P_i$ circuit 500 represents one embodiment for implementing equation 1. The !$P_i$ circuit 510 represents one embodiment for implementing a logical complement of equation 1. The $G_i$ circuit 520 represents one embodiment for implementing equation 2. The $Z_i$ circuit 530 represents one embodiment for implementing equation 3. The $P_i$ circuit 500, the !$P_i$ circuit 510, the $G_i$ circuit 520, and the $Z_i$ circuit 530 also use keeper circuits 504, 514, 524, and 534, respectively. The keeper circuits 504, 514, 524, and 534 "keep" the respective output signal from floating when not being actively driven. Clock circuits 505, 515, 525, and 535 operate with a precharge and an evaluate state, with the precharge state preceding the activation of the pulsed address signals $Ap_i$, !$Ap_i$, $Bp_i$, and !$Bp_i$ generated from the pulsed latch interface 304 with timing appropriate for a lookup compare operation.

Figure 5E:
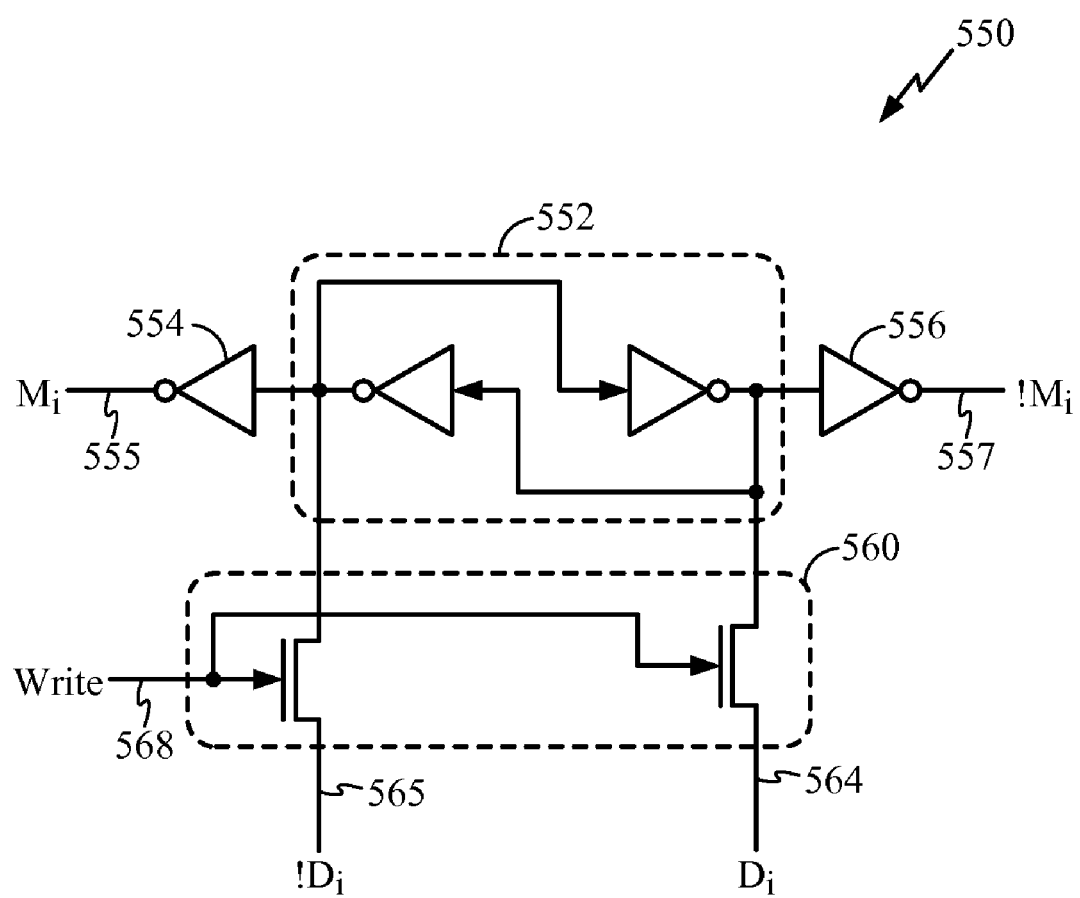
FIG. 5E illustrates a single memory cell.

FIG. 5E illustrates an exemplary single memory cell 550. The memory cell 550 is represented by a pair of cross coupled inverters 552 with buffer inverter 554 producing memory signal $M_i$ 555 and buffer inverter 556 producing inverted memory signal !$M_i$ 557. When a new tag value is to be written, new tag T' values are provided to the memory cells such as the $i^{th}$ data input ($D_i$) 564 and (!$D_i$) 565. The new tag T' values are written to the memory cells under control of a write signal 568, such as write row[j] signal 414 of FIG. 4.

FIG. 6A illustrates an S signal circuit 600 with $S_i$ and !$S_i$ signals dependent upon memory cell input values. The $S_i$ signal 602 is generated by an exclusive NOR gate 603 according to equation 14 based on memory cell signal $M_i$ 604 and the next lowest significant bit adjacent memory cell signal $M_{i-1}$ 605. The !$S_i$ signal 606 is generated by inverter 607.

FIG. 6B illustrates the new SAC circuit 610 for use with the memory cells of FIG. 4. The new SAC circuit 610 comprises a first minterm circuit 616, a second minterm circuit 622, a clock circuit 628, and a keeper circuit 630. In one embodiment, NFETs are used to implement the new SAC minterm circuits 616 and 622. The first minterm circuit 616 operates according to the combined minterm equations of the Table of Final Minterms above. For example, a $G_{i-1}$, !$M_i$ circuit 618 operates according to minterm !$P_i$ & $G_{i-1}$ & !$M_i$. Also, a $P_{i-1}$, $S_i$ circuit 619 operates according to minterm !$P_i$ & $P_{i-1}$ & $S_i$. Additionally, a $Z_{i-1}$, $M_i$ circuit 620 operates according to minterm !$P_i$ & $Z_{i-1}$ & $M_i$. The second minterm circuit 622 operates according to the combined minterm equations of the Table of Final Minterms above. For example, a $G_{i-1}$, $M_i$ circuit 624 operates according to minterm $P_i$ & $G_{i-1}$ & $M_i$. Also, a $P_{i-1}$, !$S_i$ circuit 625 operates according to minterm $P_i$ & $P_{i-1}$ & !$S_i$. Further, a $Z_{i-1}$, !$M_i$ circuit 626 operates according to minterm $P_i$ & $Z_{i-1}$ & !$M_i$. The clock circuit 628 operates according to the dynamic nature of the circuit and with an evaluate phase timed with the pulsed $P_i$ signal 502 in FIG. 5A, the pulsed !$P_i$ signal 512 in FIG. 5B, the pulsed $G_i$ signal 522 in FIG. 5C, and the pulsed $Z_i$ signal 532 in FIG. 5D, according to the "$i^{th}$" and "i-$1^{th}$" signal governed by the corresponding minterm. Keeper circuit 630 "keeps" the respective $H_i[j]$ signal 632 from floating when not being actively driven. In a dynamic structure, the new SAC circuit 610 is advantageously implemented in a three deep NFET device stack as shown in FIG. 6B thereby reducing the latency of determining a miscompare.

FIG. 6C illustrates an end SAC circuit 650 for use with the least significant bit (LSB) memory cell $404_{12}$ of FIG. 4. The end SAC circuit 650 comprises a first LSB minterm circuit 656, a second LSB minterm circuit 662, a clock circuit 668, and a keeper circuit 670. In one embodiment, NFETs are used to implement the end SAC minterm circuits 656 and 662. The first LSB minterm circuit 656 operates according to the combined minterm equations of the Table of Final LSB Minterms above. For example, a !$P_{12}$, !$M_{12}$ circuit 658 operates according to minterm $C_{in}$ & !$P_{12}$ & !$M_{12}$. Also, a $P_{12}$, $M_{12}$ circuit 659 operates according to minterm $C_{in}$ & $P_{12}$ & $M_{12}$. The second LSB minterm circuit 662 operates according to the combined minterm equations of the Table of Final Minterms above. For example, a $P_{12}$, !$M_{12}$ circuit 664 operates according to minterm !$C_{in}$ & $P_{12}$ & !$M_{12}$. Also, a !$P_{12}$, $M_{12}$ circuit 665 operates according to minterm !$C_{in}$ & !$P_{12}$ & $M_{12}$. The clock circuit 668 operates according to the dynamic nature of the circuit with an evaluate phase timed with the pulsed $P_i$ signal 502 in FIG. 5A, the pulsed !$P_i$ signal 512 in FIG. 5B, according to the "12th" signal governed by the corresponding minterm. Keeper circuit 670 "keeps" the respective $H_{12}[j]$ signal 672 from floating when not being actively driven. In a dynamic structure, the end SAC circuit 650 is advantageously implemented in a three deep NFET device stack as shown in FIG. 6C thereby reducing the latency of determining a miscompare.

Figure 7:
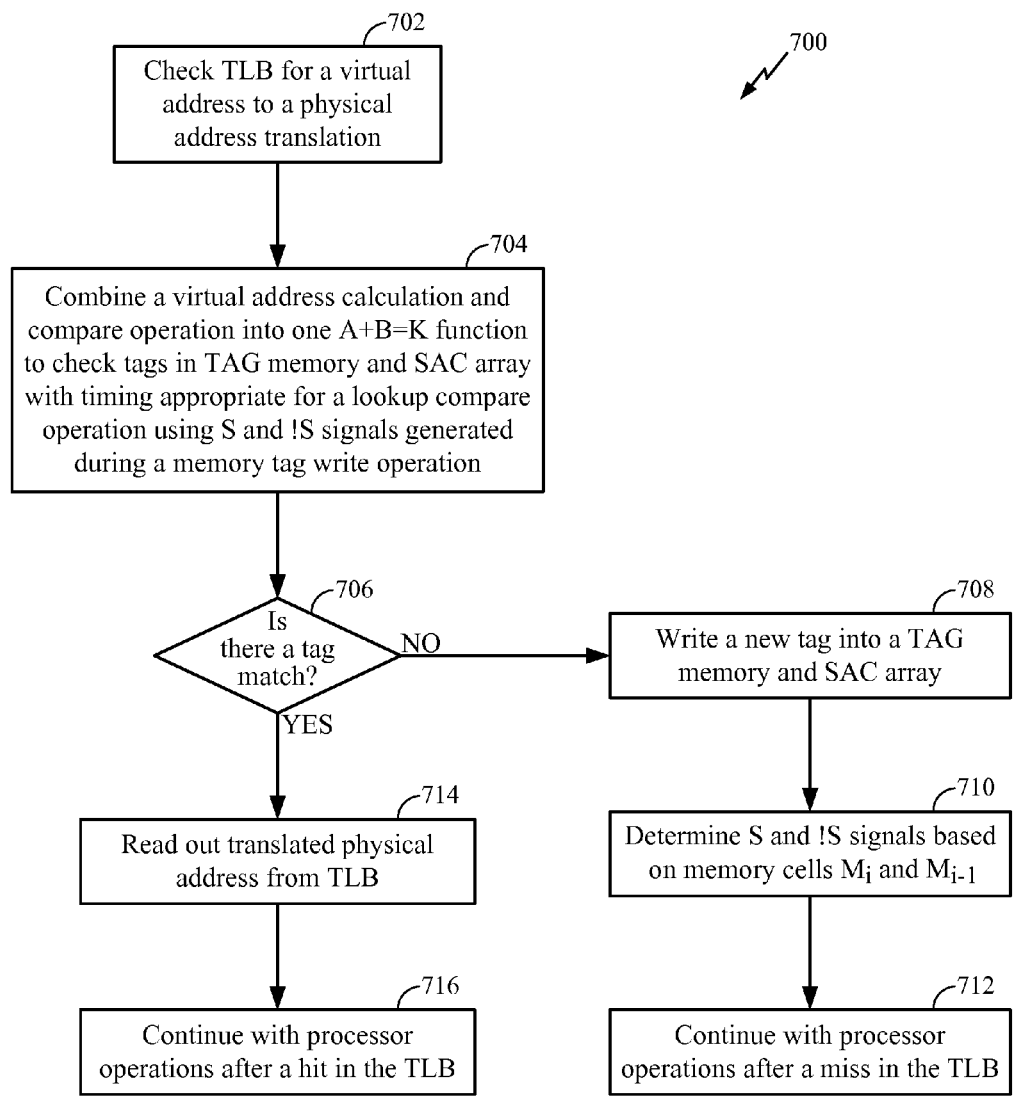
FIG. 7 illustrates a compare process to generate an A+B=K function with low latency by separating the A+B=K function into a first set of logic functions dependent upon memory cell bits and a second set of logic functions dependent upon address input signals.

FIG. 7 illustrates a compare process 700 to generate an A+B=K function with low latency by separating the A+B=K function into a first set of logic functions dependent upon memory cell bits and a second set of logic functions dependent upon address input signals. This process 700 may be suitably employed for use in a processor system, such as the processor system 200 of FIG. 2. At block 702, address signals are supplied to a TLB to check the TLB for a virtual address to physical address translation. At block 704, a virtual address calculation is combined with a compare operation into one A+B=K function to check tags in the TAG memory and SAC array with timing appropriate for a lookup compare operation using the S and !S signals generated during a memory tag write operation. At decision block 706, a determination is made whether there is a tag match. If a tag mach was not detected, the compare process 700 may proceed to block 708. At block 708, a new tag is written into the TAG memory and SAC array. At block 710, $S_i$ and $!S_i$ signals are determined based on memory cells $M_i$ and $M_{i-1}$. At block 712, the process 700 continues with operations after a miss in the TLB. Returning to decision block 706, if a tag match is detected, the compare process 700 proceeds to block 714. At block 714, a translated physical address is read out of the TLB. At block 716, the process 700 continues with operations after a hit in the TLB.

The A+B=K process described in the above description and FIGs. has been simulated and verified for correct operation. Circuit simulation techniques have also been used to verify that a three deep NFET stack as shown in FIGS. 6B and 6C provides improvements with respect to system timing concerns.

It is noted that tag write operations are infrequent in a TLB operation as compared to lookup read compare operations. For example, in a number of simulations over 1,300 lookup compare operations occurred for every four tag write operations. Thus, switching power for the presently described TLB is low due in part to the $S_i$ and $!S_i$ circuits which may switch only after a tag write operation.

The various illustrative logical blocks, modules, circuits, elements, or components described in connection with the embodiments disclosed herein may be employed with a general purpose processor, a digital signal processor (DSP), an application specific integrated circuit (ASIC), and may be implemented using a field programmable gate array (FPGA) or other programmable logic components, discrete gate or transistor logic, discrete hardware components, or any combination thereof designed to perform the functions described herein. A processor may be a general purpose microprocessor, but in the alternative, the processor may be any conventional processor, controller, microcontroller, or state machine. A processor may also be implemented as a combination of computing components, for example, a combination of a DSP and a general purpose microprocessor, a plurality of microprocessors, one or more microprocessors in conjunction with a DSP core, or any other such configuration appropriate for a desired application.

The methods described in connection with the embodiments disclosed herein may be embodied directly in hardware and supported by one or more software modules executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

While the invention is disclosed in the context of illustrative embodiments for use in processor systems it will be recognized that a wide variety of implementations may be employed by persons of ordinary skill in the art consistent with the above discussion and the claims which follow below. For example, fixed function implementation may also utilize various embodiments of the present invention.

What is claimed is:

1. A method for sum address compare (A+B=K) operation, wherein A and B are supplied address input signals and K is a previous value stored in a plurality of memory cells, the method comprising:
   generating in each memory cell of the plurality of memory cells a single logic gate circuit output and its inversion in response to updating the memory cells, wherein each single logic gate circuit has an associated memory cell output as a first input and a next lowest significant bit adjacent memory cell output as a second input; and
   generating in each of the memory cells a portion of the A+B=K operation associated with each memory cell in a partial lookup compare circuit, wherein the corresponding address input signals A and B are combined with the associated memory cell output and the generated single logic gate circuit output and its inversion during a read lookup compare operation.

2. The method of claim 1, wherein the portion of the A+B=K operation associated with each memory cell is generated in a three deep stack of transistors.

3. The method of claim 2, wherein the transistors are N channel metal oxide semiconductor field effect transistors (NFETs).

4. The method of claim 1, wherein the sum address compare (A+B=K) operation is used in a content addressable memory (CAM).

5. The method of claim 4, wherein the CAM is used in a translation look aside buffer (TLB).

6. The method of claim 1, wherein the single logic gate circuit comprises:
   an exclusive NOR circuit having an $i^{th}$ memory cell ($M_i$) and an i-$1^{th}$ memory cell ($M_{i-1}$) as inputs and producing output signal $S_i$ (!$M_i$ & !$M_{i-1}$)|($M_i$ & $M_{i-1}$).

7. The method of claim 1 further comprising:
   generating in each memory cell a hit indication upon A+B being equal to one of the stored K values.

8. The method of claim 1 further comprising:
   writing A+B to a tag array in a content addressable memory upon A+B being not equal to one of the stored K values.

9. The method of claim 1, wherein the generating in each of the memory cells a portion of the A+B=K operation comprises:
   computing a first portion of A+B=K in a first minterm circuit to generate a miss indication upon determining A+B is not equal to K; and
   computing a second portion of A+B=K in a second minterm circuit to generate a miss indication upon determining A+B is not equal to K.

10. The method of claim 9, wherein results of the first minterm circuit logically ORed with results of the second minterm comprises a full A+B=K operation.

11. An apparatus for sum address compare (A+B=K) operation, wherein A and B are supplied address input signals and K is a previous value stored in memory cells, the apparatus comprising:
   a single logic gate circuit included in each memory cell having an associated memory cell output as a first input and a next lowest significant bit adjacent memory cell output as a second input and generating an output signal S and its logical negation signal !S in response to updating the memory cells; and
   a sum address compare circuit generating in each of the memory cells a portion of the A+B=K operation associated with each memory cell for a lookup compare operation during which the corresponding address input signals A and B are enabled to be combined with the associated memory cell output and the S signal and !S signal.

12. The apparatus of claim 11 further comprising:
a $P_i$ circuit producing output signal $P_i=(A_i\&!B_i)|(!A_i\&B_i)$;
a !$P_i$ circuit producing a logical negation of the $P_i$ output signal;
a $G_i$ circuit producing output signal $G_i=A_i\&B_i$; and
a $Z_i$ circuit producing output signal $Z_i=!A_i\&!B_i$, wherein & is a logical AND function, | is a logical OR function, and ! is a logical negate function.

13. The apparatus of claim 12 further comprising:
a first minterm circuit operating according to !$P_i$ & [($G_{i-1}$ & !!$M_i$)|($P_{i-1}$ & $S_i$)|($Z_{i-1}$ & $M_i$)] which indicates a miscompare upon determining A+B is not equal to K.

14. The apparatus of claim 12 further comprising:
a second minterm circuit operating according to $P_i$ & [($G_{i-1}$ & $M_i$)|($P_{i-1}$ & !$S_i$)|($Z_{i-1}$ & !$M_i$)] which indicates a miscompare upon determining A+B is not equal to K.

15. The apparatus of claim 12 further comprising:
a first least significant bit (LSB) minterm circuit operating according to $C_{in}$ & [(!$P_{LSB}$ & !$M_{LSB}$)|($P_{LSB}$ & $M_{LSB}$)] which indicates a miscompare upon determining A+B is not equal to K.

16. The apparatus of claim 12 further comprising:
a second least significant bit (LSB) minterm circuit operating according to !$C_{in}$ & [($P_{LSB}$ & !$M_{LSB}$)|(!$P_{LSB}$ & $M_{LSB}$)] which indicates a miscompare upon determining A+B is not equal to K.

17. A method for a sum address compare (A+B=K) operation, wherein A and B are supplied address input signals and K is a previous value stored in a plurality of memory cells, the method comprising:
combining two adjacent memory bits ($M_i$, $M_{i-1}$) to generate an output signal $S_i$ as an exclusive NOR of memory bits ($M_i$, $M_{i-1}$) and its logical negation signal !$S_i$; and
combining two adjacent bits ($A_i$, $A_{i-1}$, $B_i$, $B_{i-1}$) with memory bits $M_i$ and !$M_i$ and outputs $S_i$, and !$S_i$ for a lookup compare operation to detect a miscompare, wherein ! is a logical negate function.

18. The method of claim 17 further comprising:
producing output signal $P_i=(A_i\&!B_i)|(!A_i\&B_i)$;
producing a logical negation of the $P_i$ output signal;
producing output signal $G_i=A_i\&B_i$; and
producing output signal $Z_i=!A_i\&!B_i$, wherein & is a logical AND function, | is a logical OR function, and ! is a logical negate function.

19. The method of claim 18 further comprising:
operating a first minterm circuit according to !$P_i$ & [($G_{i-1}$ & !$M_i$)|($P_{i-1}$ & $S_i$)|$Z_{i-1}$ & $M_i$)] which indicates a miscompare upon determining A+B is not equal to K.

20. The method of claim 18 further comprising:
operating a second minterm circuit according to $P_i$ & [($G_{i-1}$ & $M_i$)|($P_{i-1}$ & !$S_i$)|($Z_{i-1}$ & !$M_i$)] which indicates a miscompare upon determining A+B is not equal to K.

* * * * *